US 6,741,072 B2

(12) United States Patent
Orsillo

(10) Patent No.: US 6,741,072 B2
(45) Date of Patent: May 25, 2004

(54) DOCKING SYSTEM FOR CONNECTING A TESTER TO A PROBE STATION USING AN A-TYPE DOCKING CONFIGURATION

(75) Inventor: James E. Orsillo, 20752 Crestview Ct., Bend, OR (US) 97701

(73) Assignee: James E. Orsillo, Bend, OR (US)

( * ) Notice: Subject to any disclaimer, the term of this patent is extended or adjusted under 35 U.S.C. 154(b) by 60 days.

(21) Appl. No.: 09/949,113

(22) Filed: Sep. 7, 2001

(65) Prior Publication Data

US 2002/0050042 A1 May 2, 2002

Related U.S. Application Data

(63) Continuation-in-part of application No. 09/662,735, filed on Sep. 15, 2000, now Pat. No. 6,408,500.
(60) Provisional application No. 60/237,217, filed on Oct. 2, 2000.

(51) Int. Cl.⁷ .............................................. G01R 31/01
(52) U.S. Cl. .................................................. 324/158.1
(58) Field of Search ............................. 324/158.1, 758, 324/765, 73.1; 414/591, 592; 209/573, 574

(56) References Cited

U.S. PATENT DOCUMENTS

| | | | | |
|---|---|---|---|---|
| 4,893,074 A | * | 1/1990 | Holt et al. | ................... 324/758 |
| 4,973,015 A | * | 11/1990 | Beaucoup et al. | ........ 248/124.2 |
| 5,656,942 A | | 8/1997 | Watts et al. | |
| 5,982,182 A | * | 11/1999 | Chiu et al. | ................... 324/754 |
| 6,166,552 A | * | 12/2000 | O'Connell | ................... 324/754 |
| 6,271,658 B1 | | 8/2001 | Vallinan et al. | |

FOREIGN PATENT DOCUMENTS

| | | |
|---|---|---|
| EP | 0 699 913 A2 | 6/1996 |
| WO | WO 96/30772 | 10/1996 |

* cited by examiner

Primary Examiner—Vinh P. Nguyen
(74) Attorney, Agent, or Firm—Klarquist Sparkman, LLP

(57) ABSTRACT

A docking system that allows a Teradyne J750-type tester to be mounted to both a probe station and a handler using uniform docking hardware. Any desired probe stations may be converted into an A-type configuration so that the J750 may be used on both probe stations and handlers. In one aspect, a head stage is designed to mount uniform docking hardware to convert a probe station to an A-type configuration. In another aspect, the uniform docking hardware includes two separate mounting assemblies. One of the mounting assemblies has two kinematic docking units placed thereon. The other of the mounting assemblies has a single kinematic docking unit. The separate mounting assemblies allows ease of assembly to the probe station and is less costly to manufacture.

23 Claims, 7 Drawing Sheets

DOCKING SYSTEM FOR CONNECTING A
TESTER TO A PROBE STATION USING AN
A-TYPE DOCKING CONFIGURATION

RELATED APPLICATION DATA

This application is a Continuation-In-Part of application Ser. No. 09/662,735, entitled "METHOD OF RETROFITTING A PROBE STATION" filed on Sep. 15, 2000 now U.S. Pat. No. 6,408,500.

This application also claims priority to U.S. Provisional Patent Application No. 60/237,217, entitled "DOCKING STATION," filed on Oct. 2, 2000.

FIELD OF THE INVENTION

This invention relates generally to docking a tester to a probe station for testing integrated circuits in wafer form. More particularly, this invention relates to docking a Teradyne J750-type tester to a probe station using an A-type docking configuration.

BACKGROUND

Semiconductor testing of integrated circuits is required at various stages during the fabrication process. Each integrated circuit must be individually tested in wafer form and again in package form to ensure proper functionality. Whether in wafer form or package form, automated test equipment (ATE) transmits electrical signals to the integrated circuits and analyzes the responses to determine whether the circuits are properly operating.

In wafer form, the integrated circuits are tested using a probing system. The probing system includes a probing station (often called a prober) that moves the wafer to properly align each integrated circuit to be tested by the ATE (often called a tester). A probe card is mounted in a stationary position on the probe station and contains several hundred needles used to establish electrical contact with pads on the integrated circuit under test. A pogo tower is used to mechanically connect the tester with the probe station. More specifically, the pogo tower is brought into electrical contact with a test board or motherboard on the tester and with the probe card on the probe station. The tester then transmits electrical signals to the integrated circuit and analyzes the responses.

FIG. 1 shows a generic example of a tester, including a test head 10, mounted on a probe station 12. A test-head positioning system 14 is used to lift and lower the test head 10, which can weigh between 500 and 1000 lbs. The positioning system must be manipulated to properly align the tester with the probe card (not shown).

The testers can also be used during a separate stage of the fabrication process. More particularly, after the integrated circuits have been tested in wafer form using the probe station, the wafer is cut up and the individual integrated circuits are packaged. These individual chips are tested in a unit called a handler. When using the handler, instead of having a tester vertically lowered onto a probe station, the tester is mounted to the side of the handler. FIG. 2 shows a generic example of a tester 20 being mounted to a handler 22.

To align the tester with the probe station or handler, docking hardware is used that secures the tester in proper mechanical and electrical contact with the probe station or handler. In the case of mounting a tester to a probe station, the docking hardware is kinematic docking using a male portion on the tester and a female portion on the probe station. Once docked, the tester is properly aligned in relation to the probe station and the compression between the motherboard, pogo tower, and probe card are such that good contact is ensured.

Currently, all probe stations use a docking configuration called a B-type docking configuration. FIGS. 3 and 4 show examples of a B-type docking configuration used on many probe stations including probe stations manufactured by companies such as TSK®, EG®, and Tel®. The B-type docking configuration has kinematic docking units 26 at three corners of the mechanical interface. Although the fourth corner remains unattached, the mechanical interface is sufficient because the weight of the tester helps hold the tester in proper position above the probe station.

On the other hand, handlers use an A-type docking configuration shown in FIG. 5. The A-type docking configuration has kinematic docking units 30 on two corners and a third docking unit 32 centrally positioned on the opposite side from units 30. With the side mounting of the tester to the handler, the A-type configuration is preferable because it can better support the weight of the tester than the B-type docking configuration, which has an unattached corner.

Testers, such as the Teradyne J750, are several million dollars to purchase. The Teradyne J750 has an A-type configuration and, consequently, cannot be mounted to any existing probe station. Thus, a tester with an A-type configuration (e.g., the J750) that is mountable to a handler cannot then be used for testing on a probe station that has a B-type configuration. Thus, currently manufacturers must purchase two separate testers—one with an A-type configuration and one with a B-type configuration.

It is desirable to provide a system that allows the tester, such as the Teradyne J750, to be efficiently used with both a handler and a probe station.

SUMMARY OF THE INVENTION

The present invention allows a Teradyne J750-type tester to be mounted to both a probe station and a handler using uniform docking hardware. Handlers already have an A-type configuration for mounting to the J750. The present invention converts any desired probe station into an A-type configuration so that the J750 may be used on both probe stations and handlers. Thus, using the present invention, manufacturers of integrated circuits will need to buy fewer testers resulting in a large savings in capital expenditure.

In one aspect, a variety of headstages are designed so that the headstages fit to different types of probe stations. The head stages are designed to mount uniform docking hardware that converts the probe stations to an A-type configuration. As a result, the J750-type tester can be mounted to both handlers and a wide variety of probe stations.

In another aspect, two separate mounting assemblies are used. One of the mounting assemblies has two kinematic docking units placed thereon. The other of the mounting assemblies has a single kinematic docking unit. The separate mounting assemblies allows ease of assembly to the probe station and allows the mounting assemblies to be manufactured for low cost.

In yet another aspect, locator pins are situated on the headstage to ensure proper placement of the mounting assemblies.

These and other aspects of the invention will become apparent from the following detailed description, which makes references to the accompanying drawings.

DETAILED DESCRIPTION

Figure 1:
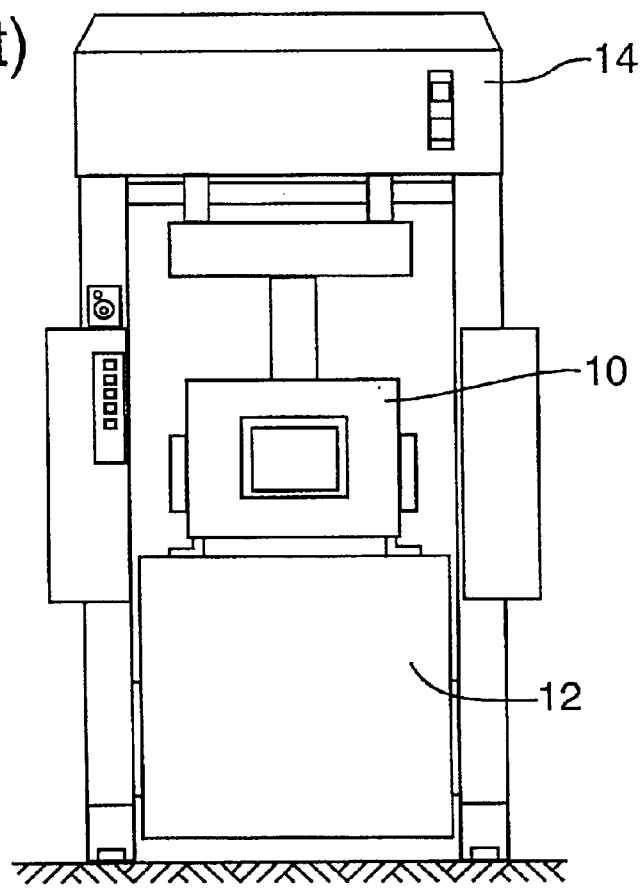
FIG. 1 shows a prior art tester mounted to a probe station.
Figure 2:
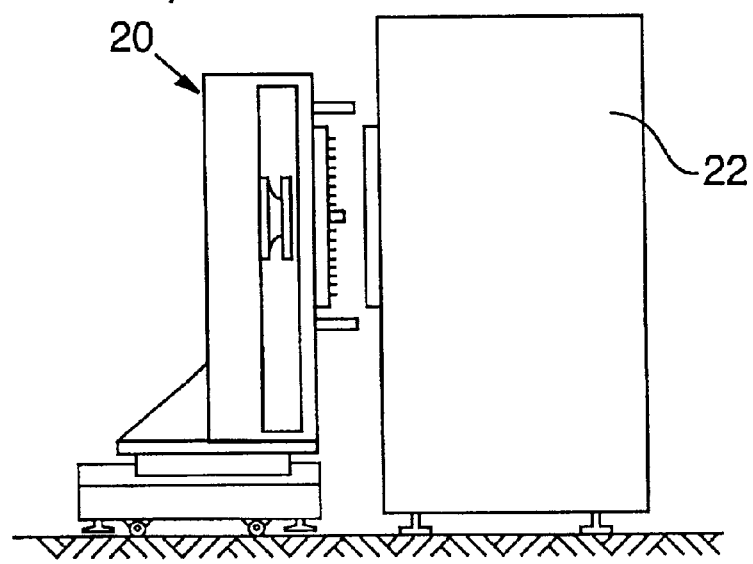
FIG. 2 shows a prior art tester being mounted to a handler.
Figure 3:
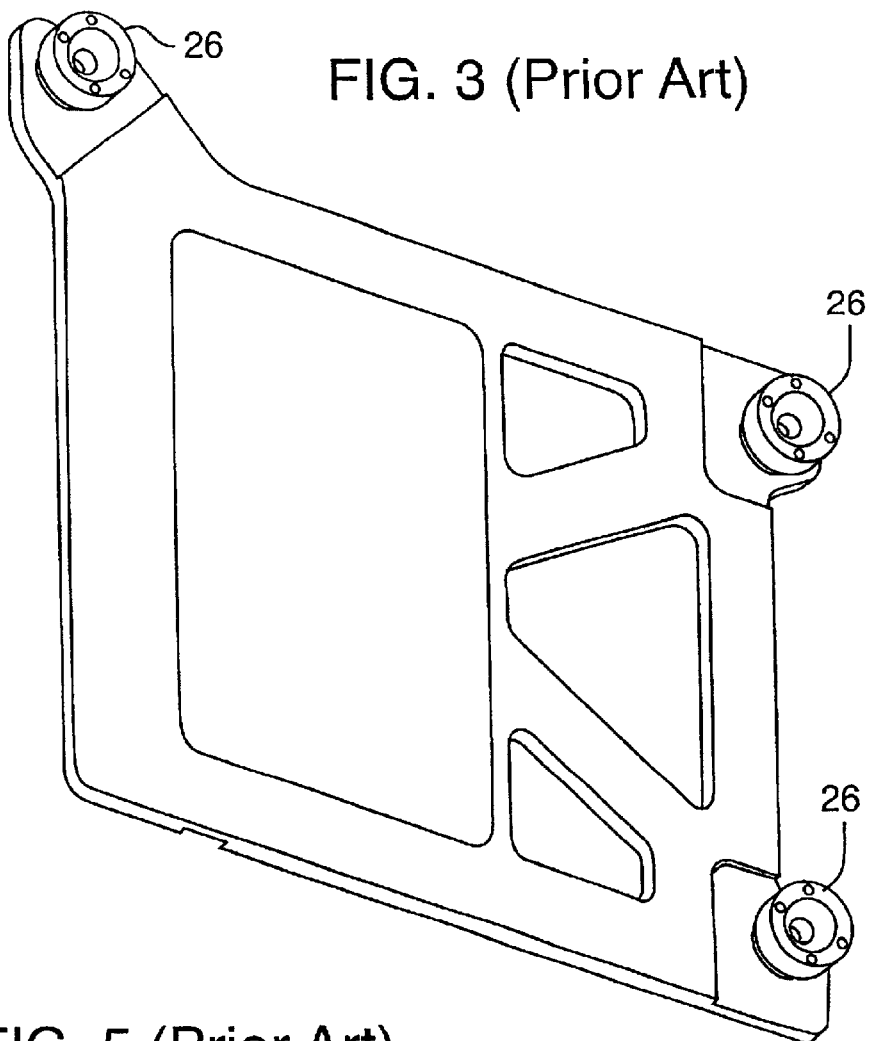
FIG. 3 shows a B-type docking configuration used on prior art probe stations.
Figure 5:
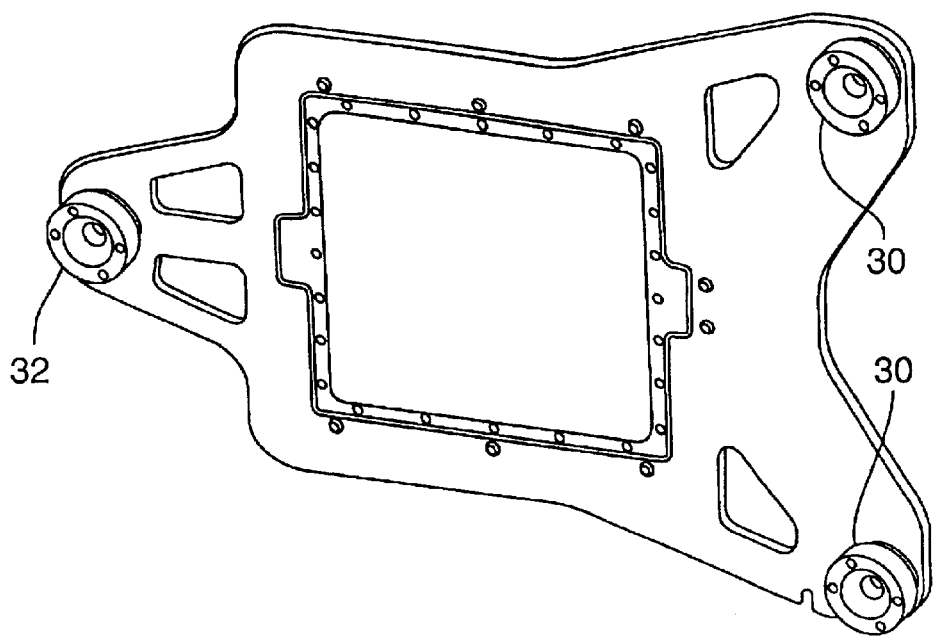
FIG. 5 shows a prior art A-type docking configuration used on handlers.
Figure 4:
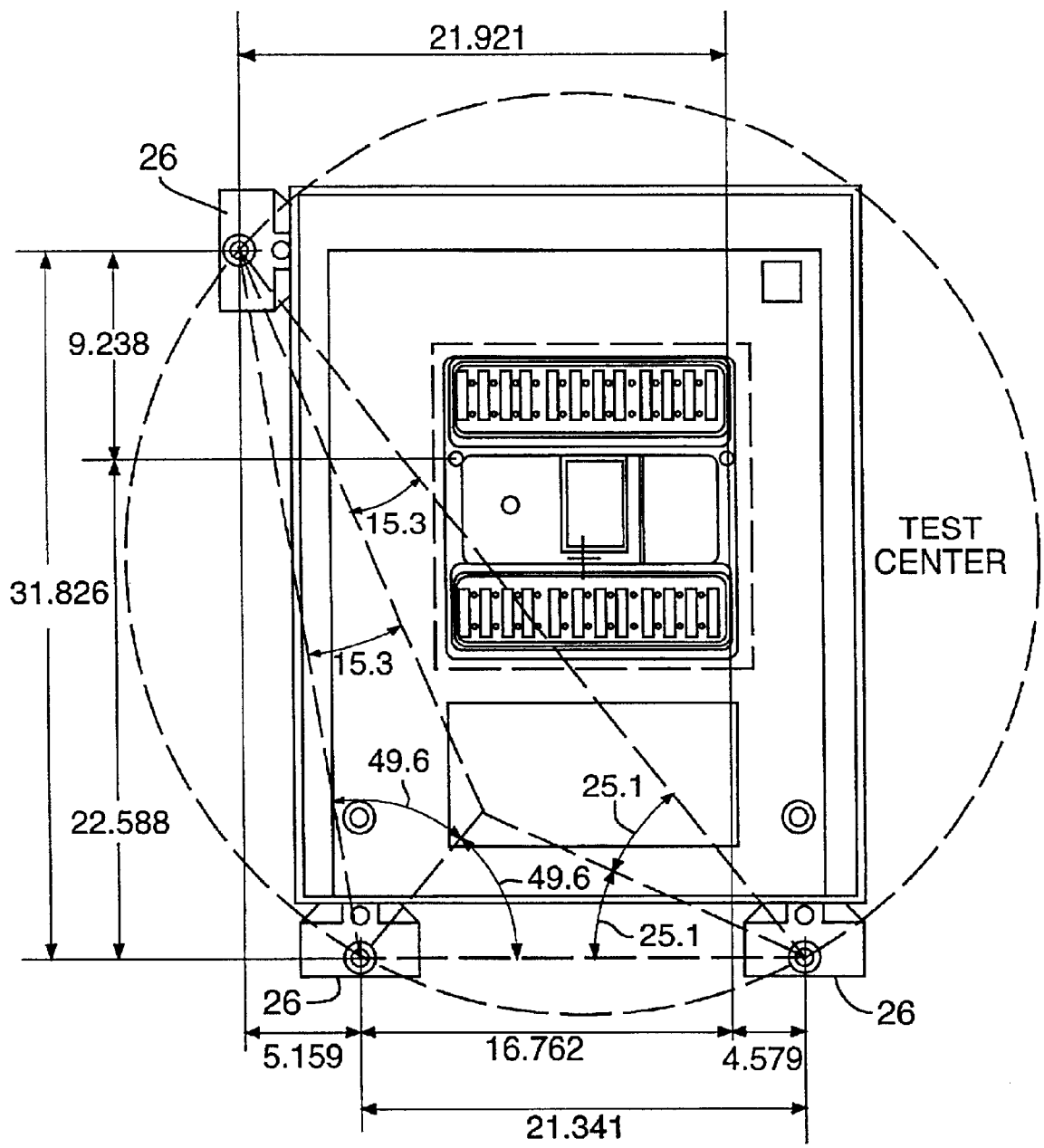
FIG. 4 shows a more detailed view of a prior art probe station having a B-type docking configuration.
Figure 6:
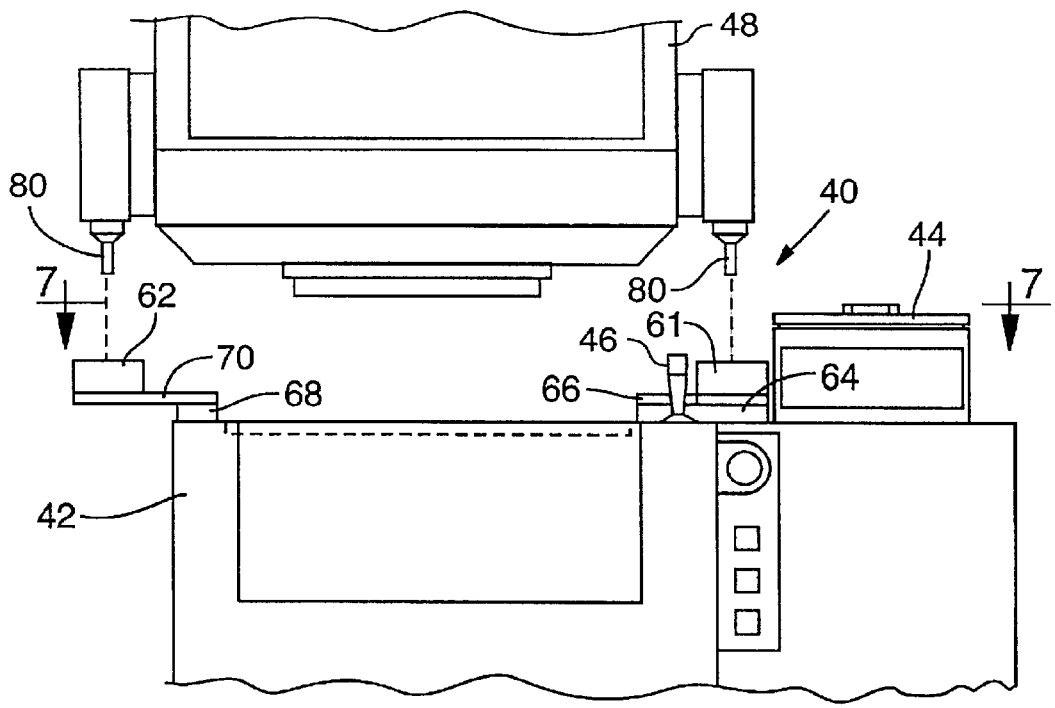
FIG. 6 shows docking hardware that allows a probe station to be converted to an A-type docking configuration.
Figure 7:
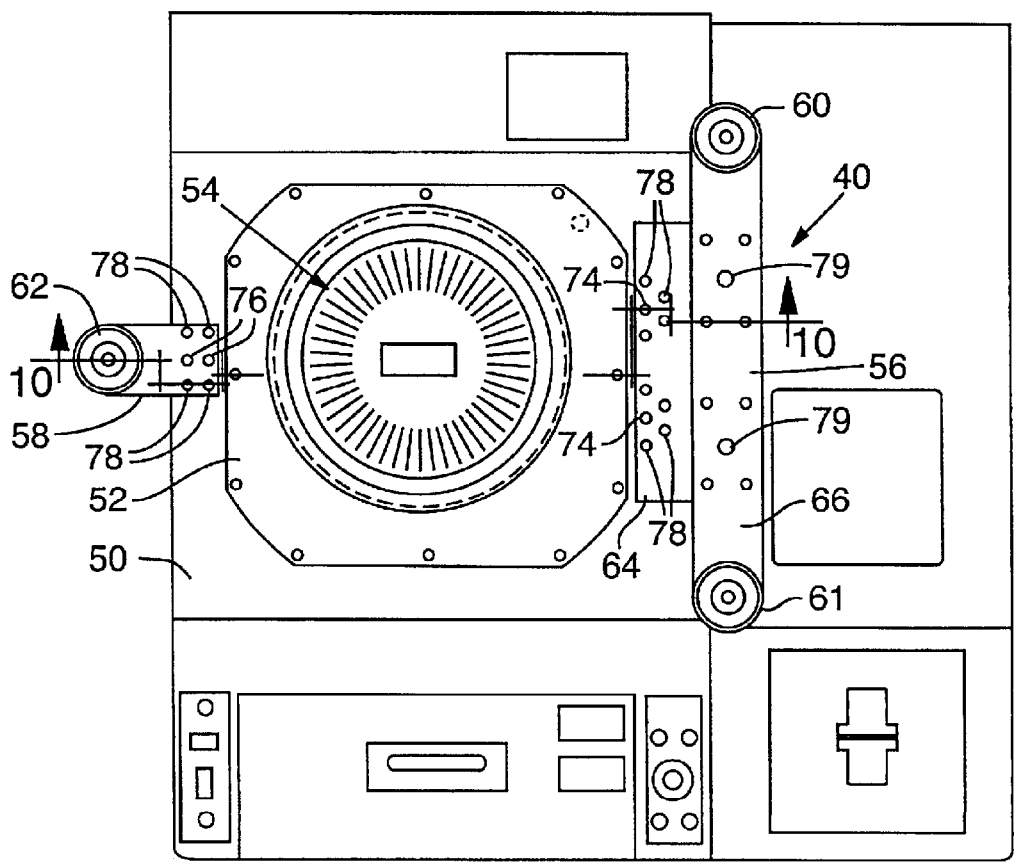
FIG. 7 shows a top view of the docking hardware of FIG. 6 as seen through lines 7—7.

FIGS. 6 and 7 show an A-type docking hardware 40 on a generic probe station 42 according to the invention. The probe station 42 can be any available probe station, such as those manufactured by TSK®, EG®, and Tel®. The probe station may include standard features, such as a wafer boat 44, operator controls 46, etc. A Teradyne J750 tester, shown generically as test head 48, mounts to the probe station using the A-type probe station docking hardware 40, as further described below.

Figure 8:
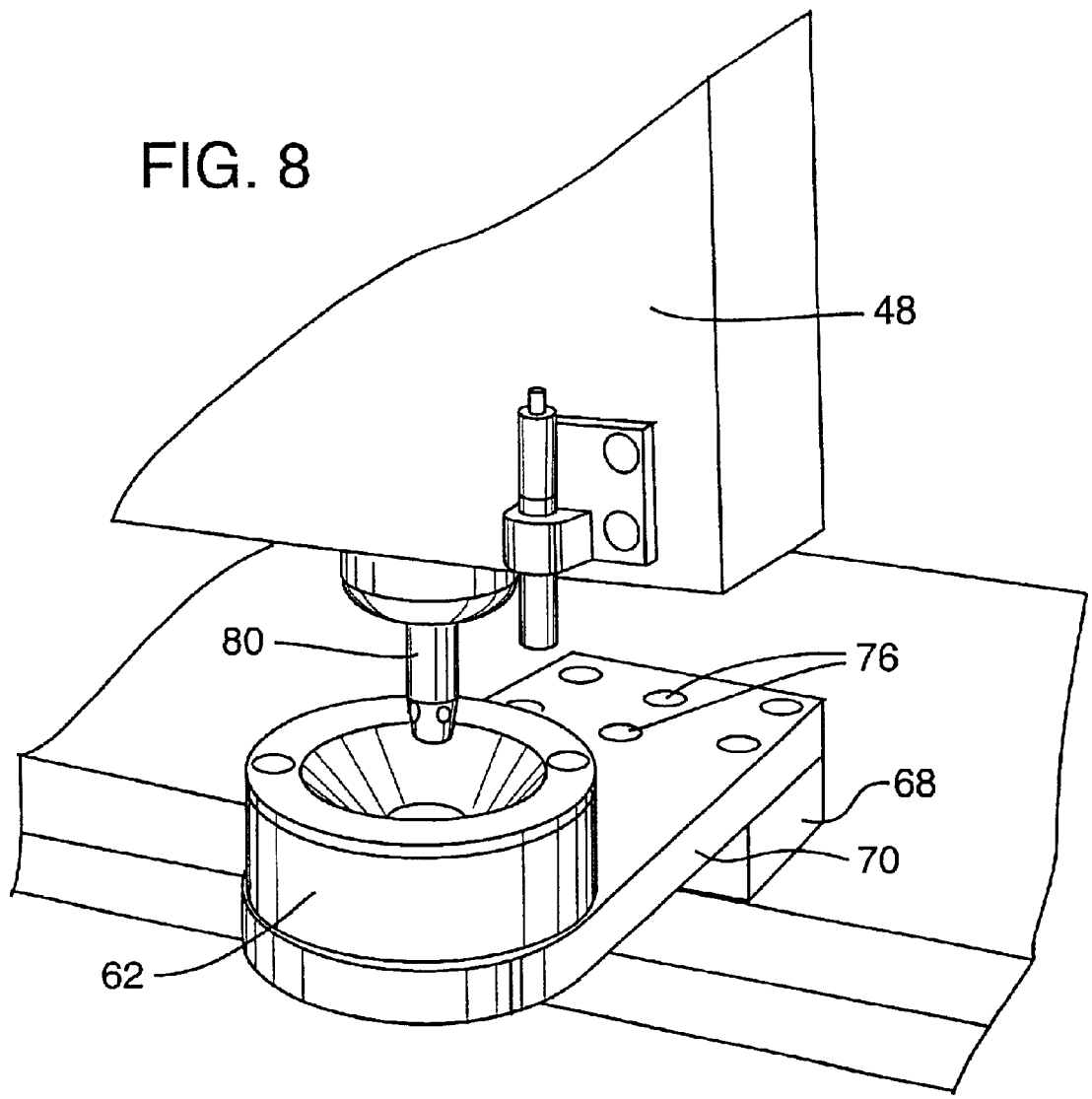
FIG. 8 shows a mounting assembly for mounting a single kinematic docking unit.

A head stage 50 (FIG. 7) has a tooling plate 52 positioned therein. The tooling plate has a central aperture for mounting of a probe-card assembly (which includes an insert ring, probe card, etc.), shown generically at 54. The A-type probe station docking hardware 40 includes K-dock mounting assemblies 56, 58. Mounting assembly 56 is a dual K-dock mounting assembly because it supports two kinematic docking units 60, 61. Mounting assembly 58 is a single mounting assembly and supports only one kinematic docking unit 62. Each of the assemblies 56, 58 include a base and an extension member. For example, assembly 56 includes base 64 and extension member 66. Similarly, assembly 58 includes base 68 and extension member 70 (see FIG. 8 for a close-up perspective view). As further described below, the bases 64, 68 are used to properly mount the docking hardware to the headstage. The extension members 66, 70 are used to locate and mount the kinematic docking units 60, 61, 62. Locator pins 74, 76 are positioned on the head stage for precise mounting of the K-dock mounting assemblies 56, 58, respectively. Screws 78 are used to secure the mounting assemblies 56, 58 to the head stage 50. Locator pins 79 may also be located on base 64 for ease of mounting extension member 66. The locator pins 79 may be eliminated by integrating the base 64 and extension member 66. As shown in FIG. 6, the Teradyne J750 has male-type mounting hardware 80 that mates with the A-type docking hardware 40 to align the tester to the probe station with proper compression between the motherboard, pogo tower, and probe card (not shown).

Figure 9:
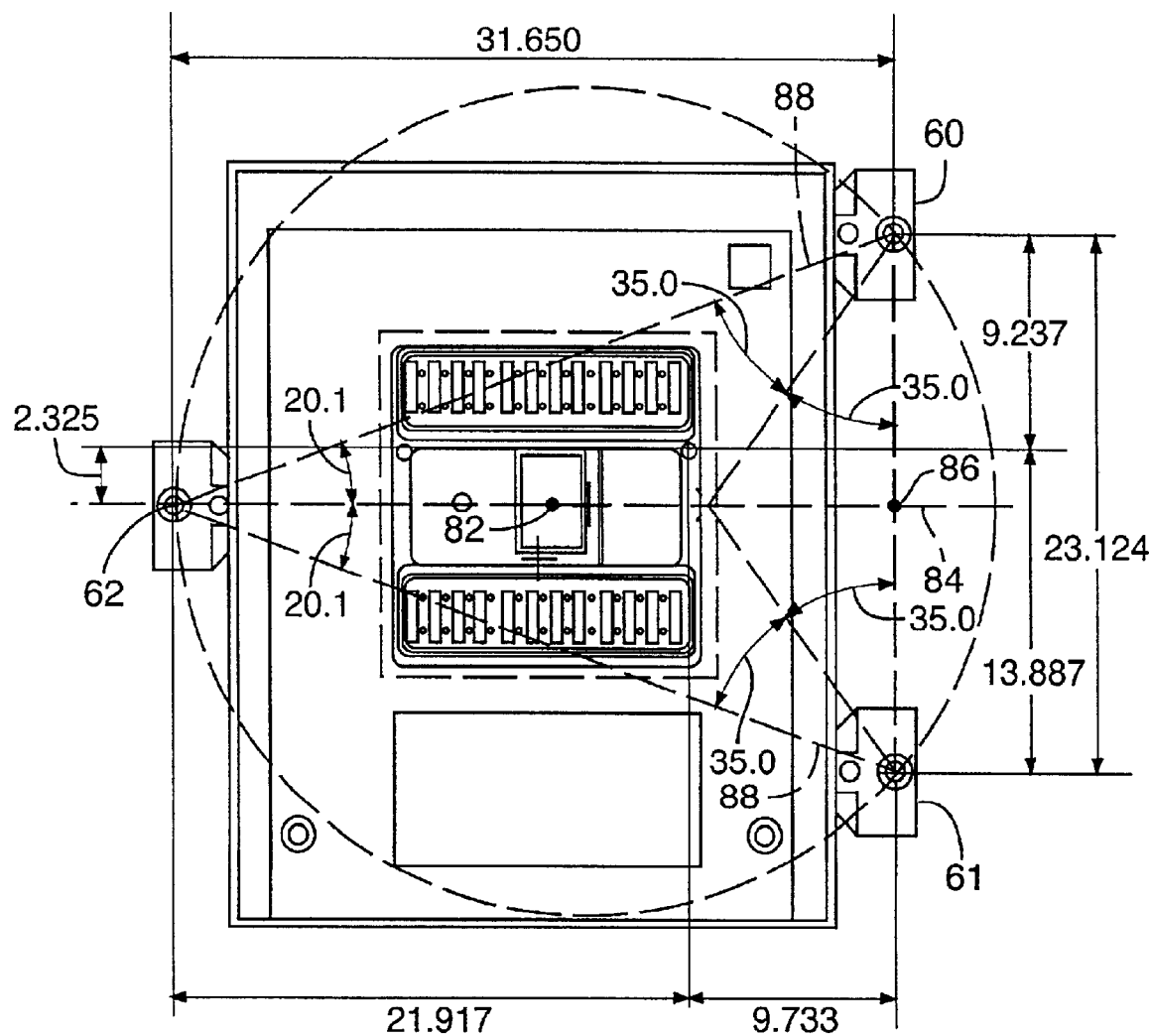
FIG. 9 shows a detailed top view showing the location of the kinematic docking units according to an A-type configuration.

FIG. 9 shows a generic top view of the kinematic docking units 60, 61, 62 mounted to a probe station in an A-type configuration. Specific docking hardware is not shown because any desired docking hardware may be used to mount the kinematic docking units in an A-type configuration. For example, instead of having two separate mounting assemblies, a single mounting assembly may be used. Additionally, three mounting assemblies may be used, one for each kinematic docking unit. Still further, the docking units can be integrated into the headstage. Those skilled in the art will recognize that there are a wide variety of possible docking configurations that may be used to convert a probe station to an A-type configuration and the invention is not limited to the particular A-type docking hardware shown.

A test center is shown at point 82. A probe card (not shown) sits centered on the test center 82. A latitudinal axis 84 passes through the test center. Two mirror image docking units 60, 61 are positioned on the right side of the head stage and placed equal distances from point 86 on the latitudinal axis 84. Specifically, each docking unit 60, 61 is placed 11.562" from the latitudinal axis. On the opposite side of the headstage 50 from docking units 60, 61, the docking unit 62 is placed on the latitudinal axis at a distance 31.650" from point 86. The placement of the docking units conforms to the A-type configuration. The dimensions and angles of the A-type configuration may vary, but the general structure is to have three docking units with two equally spaced from a latitudinal axis and a third docking unit on the latitudinal axis. The docking units 60, 61, 62 have a particular orientation identified by a K-groove. In the illustrated embodiment, the K-grooves of the docking units 60, 61 are aligned along angle lines 88, while the K-groove of docking unit 62 is along the latitudinal axis.

Figure 10:
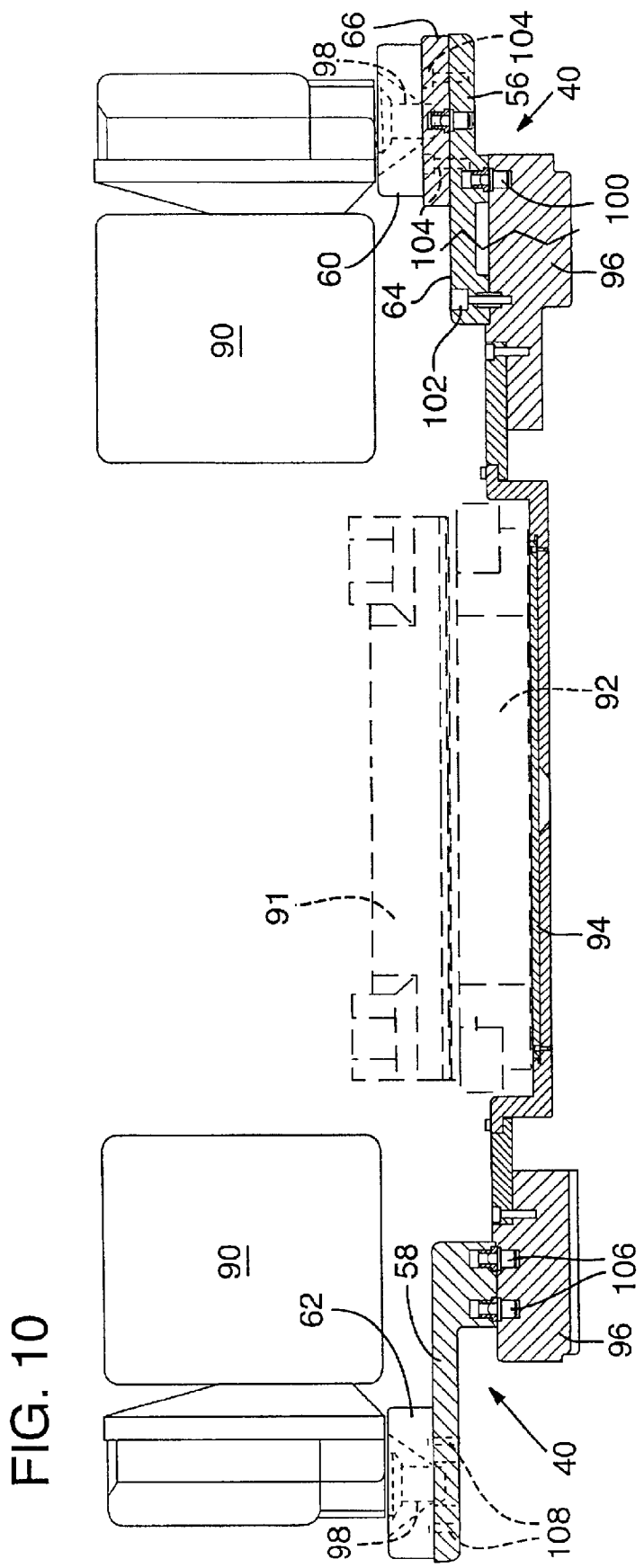
FIG. 10 shows a cross-sectional view of the docking hardware through lines 10—10 in FIG. 7.

FIG. 10 shows a cross-sectional view of the A-type probe station docking hardware 40 with a Teradyne J750 tester 90 locked in a testing position. The test head 91 of the tester is positioned on top of a pogo tower 92. A probe card 94 sits beneath the pogo tower 92 and in mounted to a head stage 96. The test head, pogo tower and probe card must be properly compressed to ensure good connectivity. The docking hardware 40 is designed such that when the male-type mounting hardware 98 of the tester 90 is docked in the kinematic docking units 60, 61, 62, the proper compression is achieved. Locator pins 100 are fixed in the headstage 96 so that the base 64 of mounting assembly 56 can be properly positioned on the headstage. Screws 102 secure the base 64 to the headstage. The kinematic docking unit 60 is secured to the extension member 66 by screws 104. Similarly, mounting assembly 58 is positioned on the head stage by locator pins 106. Screws (not shown) secure the mounting assembly to the head stage. Additionally, screws 108 secure the docking unit 62 to the mounting assembly 58.

Having illustrated and described the principles of the illustrated embodiments, it will be apparent to those skilled in the art that the embodiments can be modified in arrangement and detail without departing from such principles.

In view of the many possible embodiments, it will be recognized that the illustrated embodiments include only examples of the invention and should not be taken as a limitation on the scope of the invention. Rather, the invention is defined by the following claims. I therefore claim as the invention all such embodiments that come within the scope of these claims.

I claim:

1. A docking system for docking a tester to a probe station having a headstage to test integrated circuits in wafer form, comprising:

three kinematic docking units; and docking hardware connectable to the headstage on the probe station, the docking hardware configured to mount the three kinematic docking units in an A-type docking configuration on the probe station.

2. The docking system of claim 1, wherein the tester is a J750-type tester.

3. The docking system of claim 1, wherein the A-type docking configuration has two of the kinematic docking units on one side of the headstage and equally spaced from a latitudinal axis extending through a test center point and a third of the kinematic docking units placed along the latitudinal axis.

4. The docking system of claim 3, wherein the docking units on the same side of the headstage are placed 23.124" apart.

5. The docking system of claim 3, wherein the third docking unit is placed 31.650" along the latitudinal axis from the other docking units.

6. The docking system of claim 1, wherein the docking hardware includes first and second separate mounting assemblies, the first mounting assembly mounting two kinematic docking units and a second mounting assembly mounting one kinematic docking unit.

7. The docking system of claim 6, wherein the first mounting assembly has a base portion for connecting to the headstage and an extension portion for mounting the two kinematic docking units.

8. The docking system of claim 6, wherein the second mounting assembly has a base portion for connecting to the headstage and an extension portion for mounting the one kinematic unit.

9. The docking system of claim 1, further including locator pins positioned on the headstage for properly aligning the docking hardware on the headstage.

10. A docking system for docking a tester to a probe station having a headstage to test integrated circuits in wafer form, comprising:

means for aligning docking hardware on the headstage of the probe station; and means for mounting the docking hardware to the probe station in an A-type docking configuration.

11. A docking system for retrofitting a probe station having a headstage with other than an A-type docking configuration to dock with a tester for testing integrated circuits in wafer form having an A-type docking configuration, the system comprising:

a first mounting assembly mountable to a first side of the headstage, the first mounting assembly including first and second kinematic docking units; and a second docking assembly mountable to a second side of the headstage opposite the first side, the second docking assembly including a third kinematic docking member, the first and second docking assemblies being positionable such that the first, second and third kinematic docking units are in an A-type docking configuration in which the third docking unit adjacent the second side is approximately equidistant from each of the first and the second kinematic docking units adjacent the first side.

12. The docking system of claim 11, wherein the tester is a J750-type tester.

13. The docking system of claim 11, wherein in the A-type docking configuration, the first and second kinematic docking units positioned adjacent the first side are equally spaced from a latitudinal axis extending through a test center point and the third kinematic docking unit is positioned on the latitudinal axis.

14. The docking system of claim 13, wherein the first and second kinematic docking units are positioned 23.124 inches apart.

15. The docking system of claim 13, wherein the third kinematic docking unit is placed 31.650 inches along the latitudinal axis from the first and second docking units.

16. The docking system of claim 11, wherein the first mounting assembly has a base portion for attachment to the headstage and an attached extension portion shaped as an elongate member having opposing ends to which the first and second kinematic docking units are attached.

17. The docking system of claim 16, wherein the extension portion of the first mounting assembly is attached to the base portion such that the opposing ends are cantilevered from the base portion.

18. The docking system of claim 11, wherein the second mounting assembly has a base portion for attachment to the headstage and an attached extension portion to which the third kinematic docking unit is attached.

19. The docking system of claim 18, wherein the extension portion of the second mounting assembly is attached to the base portion such that the extension portion is cantilevered from the base portion.

20. The docking system of claim 11, further including a plurality of locator pins for properly aligning the first and second kinematic mounting assemblies on the headstage.

21. The system of claim 20, wherein the locator pins are positioned at predetermined locations on the headstage and the first and second kinematic mounting assemblies have pin-receiving holes configured to receive respective locator pins for properly positioning the mounting assemblies on the headstage.

22. The docking system of claim 11, wherein, in the A-type docking configuration, the second kinematic mounting assembly is cantilevered outward from the second side of the headstage.

23. The docking system of claim 11, wherein the first, second and third kinematic docking units are passive female-type docking units.

* * * * *

UNITED STATES PATENT AND TRADEMARK OFFICE
CERTIFICATE OF CORRECTION

PATENT NO.    : 6,741,072 B2
DATED         : May 25, 2004
INVENTOR(S)   : James E. Orsillo It is certified that error appears in the above-identified patent and that said Letters Patent is hereby corrected as shown below:

Column 4,
Line 34, "in mounted" should read -- is mounted --

Column 5,
Line 29, "kinematic unit" should read -- kinematic docking unit --

Signed and Sealed this

First Day of February, 2005

JON W. DUDAS
*Director of the United States Patent and Trademark Office*